(12) United States Patent
Ju et al.

(10) Patent No.: US 7,261,568 B2
(45) Date of Patent: *Aug. 28, 2007

(54) ELECTRICAL CONNECTOR

(75) Inventors: Ted Ju, Keelung (TW); Wen-Chung Chang, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/333,410

(22) Filed: Jan. 18, 2006

(65) Prior Publication Data

US 2007/0077785 A1    Apr. 5, 2007

(30) Foreign Application Priority Data

Sep. 30, 2005    (CN) .................... 2005 2 0065290

(51) Int. Cl.
*H01R 12/00* (2006.01)
(52) U.S. Cl. .......................... 439/66; 439/342
(58) Field of Classification Search .............. 439/66, 439/259–268, 330–331, 342
See application file for complete search history.

(56) References Cited

U.S. PATENT DOCUMENTS 7,125,274 B1 * 10/2006 Ju et al. ...................... 439/342
7,125,275 B1 * 10/2006 Ju et al. ...................... 439/342

* cited by examiner

*Primary Examiner*—Khiem Nguyen
(74) *Attorney, Agent, or Firm*—Troxell Law Office, PLLC

(57) ABSTRACT

A kind of electrical connector comprising insulator body and conductive terminal; the insulator body is installed with several terminal receptor holes; each receptor hole is installed with the first conductive terminal and the second and third conductive terminal located at the two ends of the first conductive terminal; the second and third conductive terminal could move relative to the first conductive terminal and electrically connect to each other in order to form press on contact type electrical connector. Comparing to the present art, the electrical connector of this invention prevents the two ends of the one-body conductive terminal from compression by PCB and chip module at the same time that makes the conductive terminal easily yield and deformed, making the elasticity of the terminal to become poorer and present contact problem, in order to guarantee good electrical conductivity.

10 Claims, 7 Drawing Sheets

ELECTRICAL CONNECTOR

BACKGROUND OF THE INVENTION (a) Field of the Invention

This invention is about a kind of electrical connector design, in particular a kind of electrical connector used in the pressed on contact with chip module.

(b) Description of the Prior Art:

The types of electrical connector used for connecting chip module in the business today (naturally could be two PCBs) can be as shown below. The first type is the two terminals on the two ends of the electrical connector are soldered to the PCB and chip module, respectively in order to realize the electrical communication between the PCB and the chip module. This type of electrical connector is hard to take out when the chip module is damaged and needs replacement. The whole PCB and the chip on it will have to be disposed. To solve this problem, the industry has invented another kind of electrical connector. One end of the said electrical connector is soldered to PCB, and the other end of the terminal connecting to the chip module and electrical connector uses insertion type contact. Now, the chip module could be taken out from the electrical connector at any time and is very convenient for the user. However, to simplify the production and lower cost of this art, the industry invented the third kind of electrical connector. The connection of the said electrical connector and chip module all uses press on contact. The two ends of the terminal form a contact section that could be pressed on and contact. However, the terminal of such kind of electrical connector is formed in one body, and both ends are subject to the compression by the PCB and chip module at the same time. Due to long period of compression during usage, the terminal could be yielded and deformed permanently. The elasticity of the resulting terminal could become poorer and eventually the contact become a problem and seriously affects the normal electrical conductivity.

Hence, there is a need to design a kind of improved electrical connector to overcome the above problem.

SUMMARY OF THE INVENTION

The objective of this invention is to provide a kind of improved electrical connector that could guarantee good electrical connectivity.

To realize the above objective, the electrical connector of this invention comprises the insulator body and conductive terminal, where the insulator body is installed with several receptor holes; each receptor hole is installed with the first conductive terminal as well as the second conductive terminal and the third conductive terminal locating at the two ends of the first conductive terminal; the second and third conductive terminals could be moved relatively to the first conductive terminal and electrically connected to each other in order to form a press on contact type electrical connector.

Comparing to the present art, the electrical connector of this invention is installed with the first conductive terminal and the second and third electrical connectors in each receptor hole; the second and third conductive hole could be moved relative to the first conductive terminal and in electrical contact with each other to form press on type electrical connector, avoiding the problem of the one-body type conductive connector being compressed at both ends of PCB and chip module, causing the conductive terminal to yield and become easily deformed, making the elasticity of the terminal becomes poorer and started to have contact problem, in order to guarantee good electrical conductivity.

DETAILED DESCRIPTION OF THE PREFERRED EMBODIMENTS

Figure 1:
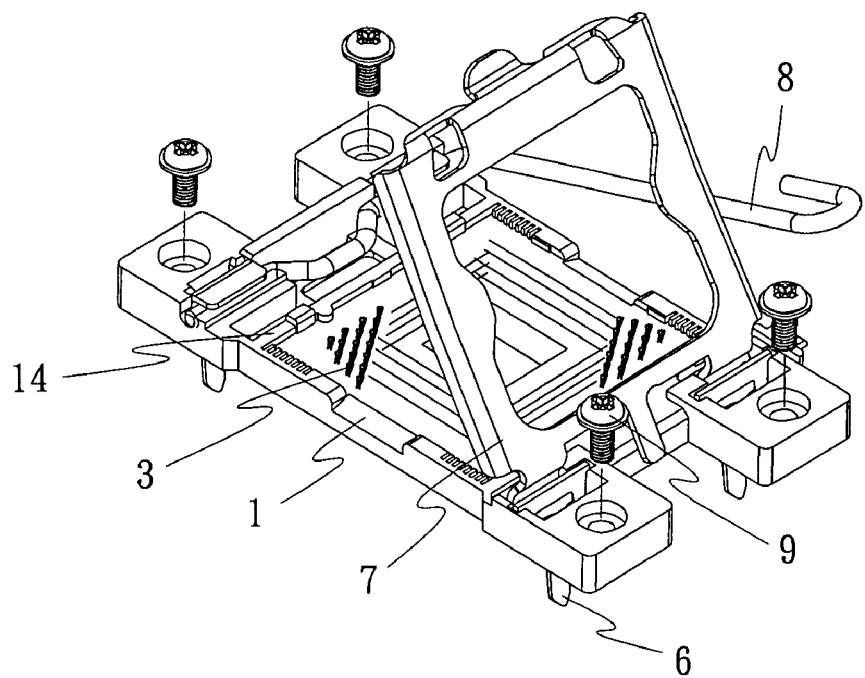
FIG. 1 is the 3D assembly diagram of the top cover of this invention when opened.
Figure 2:
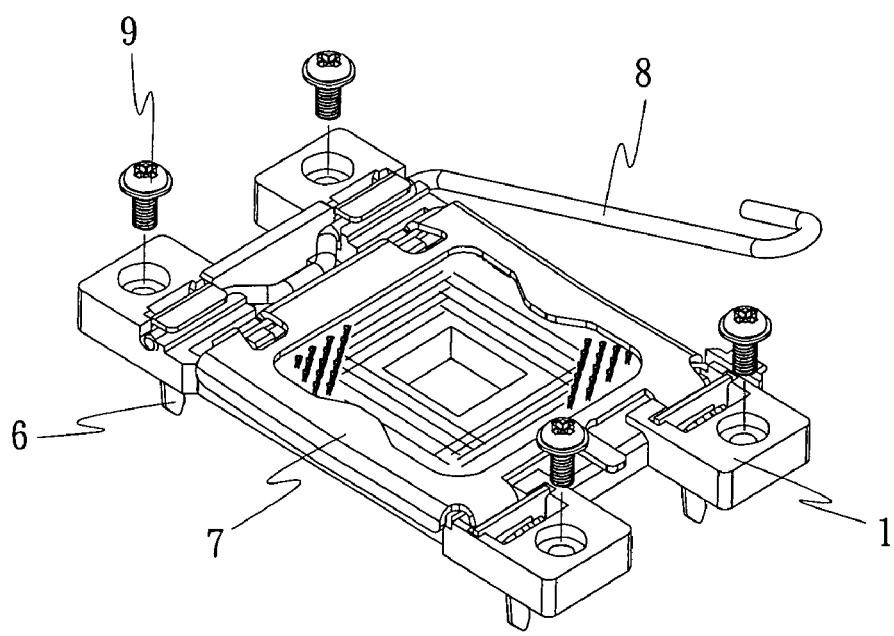
FIG. 2 is the 3D assembly diagram of the top cover of this invention when closed.
Figure 3:
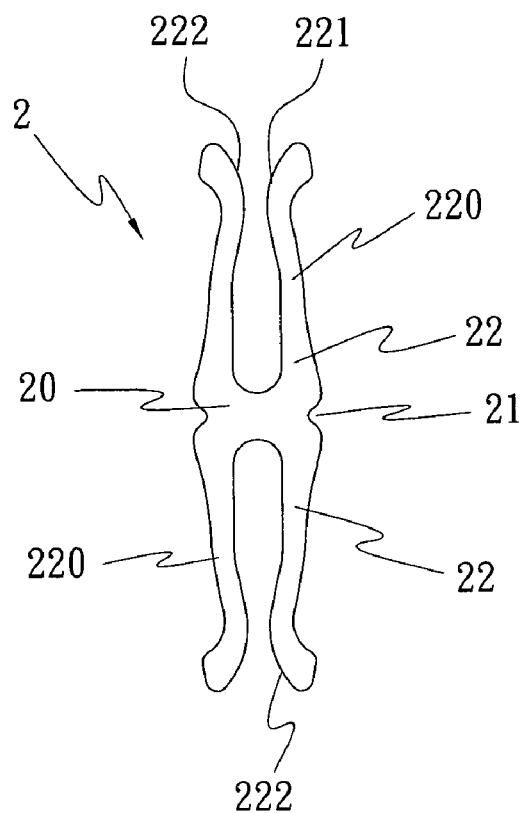
FIG. 3 is the illustration of the first conductive terminal of the electrical connector of this invention.
Figure 4:
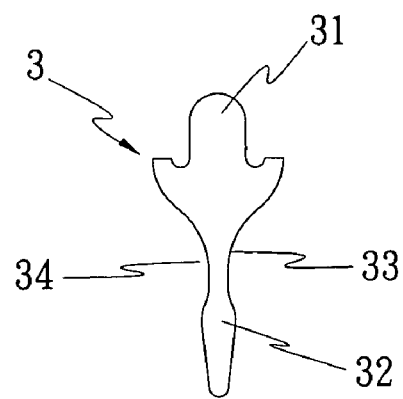
FIG. 4 is the illustration of the second or the third conductive terminals of the electrical connector of this invention.
Figure 5:
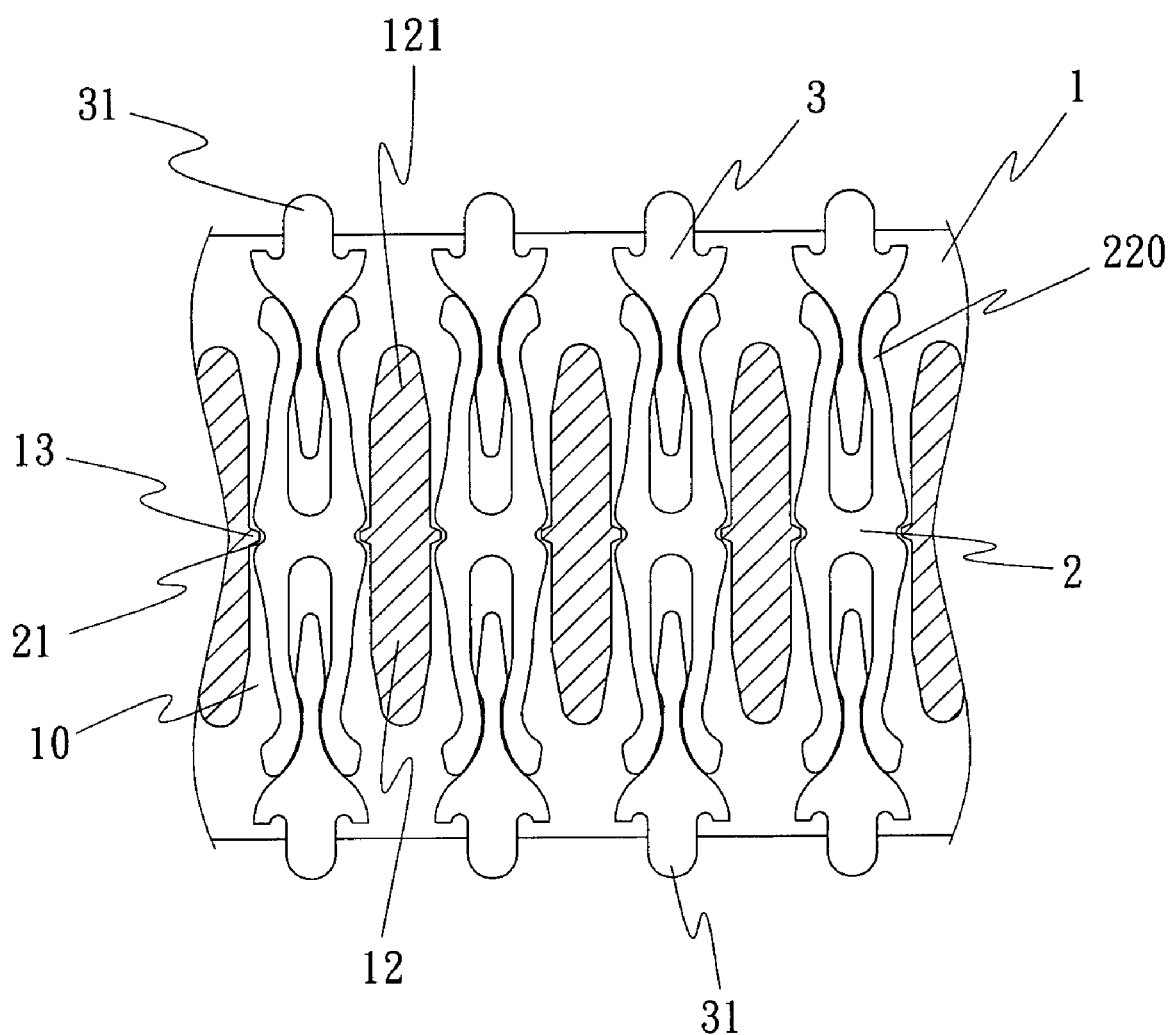
FIG. 5 is the partial view of the assembly between the insulator body and conductive terminal of the electrical connector of this invention.

Please refer to FIGS. 1 through 7. The electrical connector of this invention is intended for the connection between chip module 4 and PCB 5, comprises insulator body 1, conductive terminal and top cover body 7 installed in the insulator body 1 for pressing on chip module 4. The other end of the insulator body is installed a joystick 8 for the purpose of using top cover body 7 to press against insulator body. The connecting structure 9 and the positioning structure 6 is installed at the peripheral of the insulator body for connecting electrical connector to PCB, and the positioning structure can be soldered to PCB 5. The conductive terminal comprises the first conductive terminal 2 has similar structure with the second and the third conductive terminal 3.

The insulator body 1 is installed with several terminal receptor holes 10, each receptor hole 10 is installed with a first conductive terminal 2 and the second conductive terminal 3 and the third conductive terminal 3 that are locating at the two ends of the first conductive terminal. The adjacent housing space is installed with stopping wall 12; the end of the stopping wall forms the limiting section 121. The said limiting section 121 could restrict the excessive movement of the first conductive terminal 2. The receptor hole 10 is installed with protruding surface 13, and the top surface of the insulator body 1 is installed with positioning side frame 14. The chip module can be positioned onto the electrical connector when the chip module 4 is connected to electrical connector.

The said first, second, and third conductive terminals 2 and 3 are of different material but are metal pieces of the same shape. The said first conductive terminal 2 is copper alloy and with better elasticity. The two sides of the main section 20 and the elastic sections 22 extending at the opposite ends are installed with the depressed section 21. The elastic section 22 are two parallel elastic arms 220 in general. The ends of the elastic arms 220 are installed with corresponding protruding section 221. The protruding section 221 is installed with the first sloping surface 222. The second or the third conductive terminal 3 is pure copper with higher conductivity. One end of which protrudes out of the surface of insulator body 1 forms the conductive connection section 31 that could be connected to external electronic component (chip module 4 and PCB 5 in this embodiment, of course could be other external electronic components). One end near the first conductive terminal 2 forms the press on section 32, the press on section locates between the two elastic arms 220 and can cause the elastic arms 220 to move outward. The press on section 32 is installed with the second sloping surface 33, and on the press on section 32 is in addition installed with a groove 34. The said first sloping surface 222 could be pressed onto the second sloping surface 33; the protruding section 221 could be matched with groove 34 to make the first conductive terminal 2 and the second or third conductive terminal 3 to click together through the depression and protruding surface.

Figure 6:
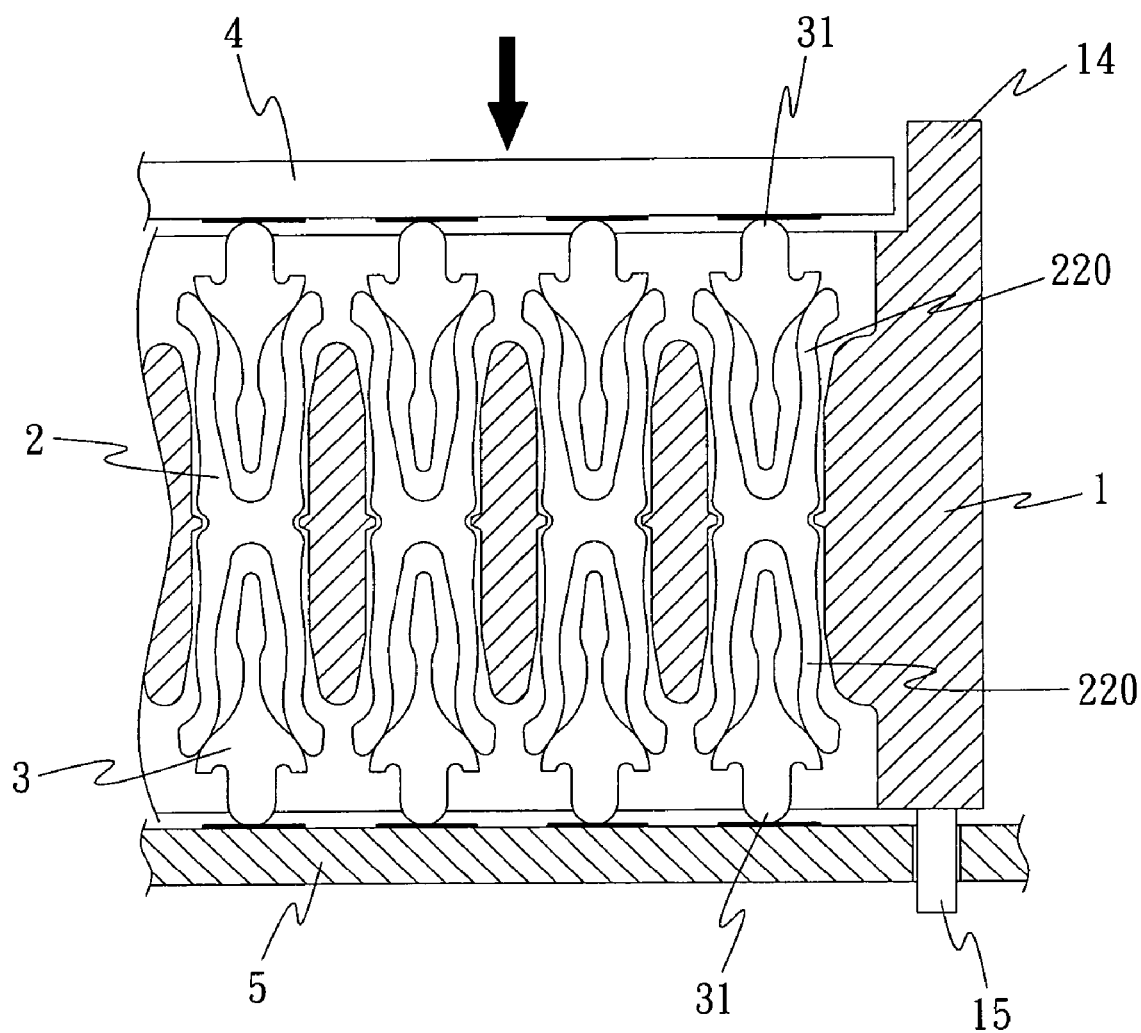
FIG. 6 is the partial view of the electrical connector of this invention when installing chip module.
Figure 7:
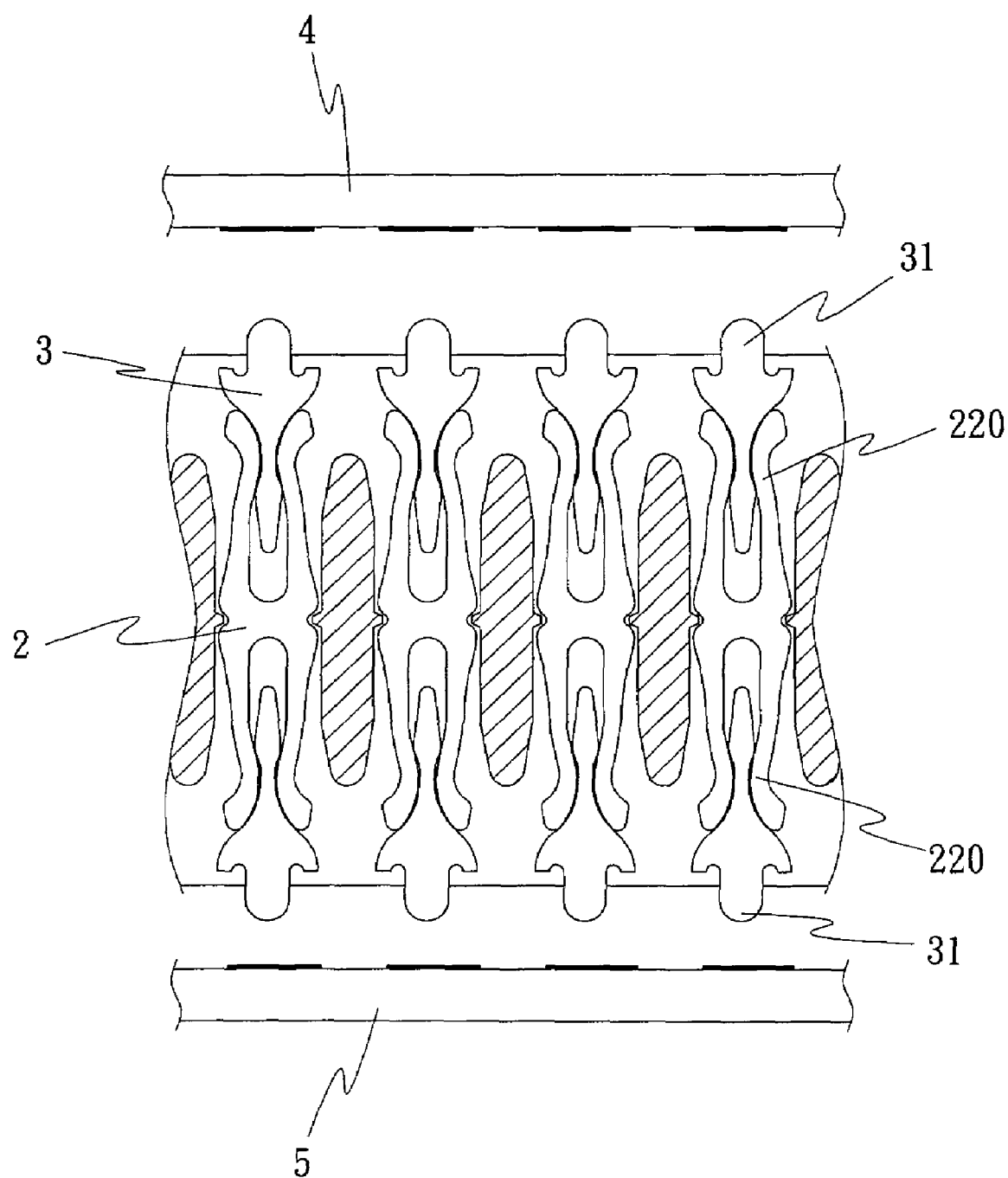
FIG. 7 is the partial view of the electrical connector of this invention before connecting to chip module.

Please refer to the illustration in FIGS. 6 and 7. When the second and third conductive terminals 3 are forced to move towards the first conductive terminal 2 during installation of chip module 4 and PCB, the respective slopes of the conductive terminals will move relative to each other and resulting the elastic arms 220 to expand outward. At this time, the limiting section 221 could restrict the excessive movement of the elastic arm 220 of the first conductive terminal to both sides, enabling the respective conductive terminals to form electrical connectivity. When not under force, the elastic arm 220 will return to original position and spring back the second and third conductive terminals 3. In this way, the press on contact electrical connector is formed.

As each receptor hole of the electrical connector of this invention is installed with the first conductive terminal and the second and third conductive terminals located at both ends of the first conductive terminal, and the second and third conductive terminal could move relative to the first conductive terminal and electrically connected to each other in order to form press on contact type electrical connector, and both ends of the first conductive terminal is installed with the elastic arm that could receive the second or third conductive terminal to form better elastic connection, preventing the conductive terminal to yield and easily deformed due to the compression of PCB and chip module on both ends of the one body conductive terminal that makes the elasticity of the terminal becomes poorer and started to have contact problem in order to guarantee good electrical conductivity.

Figure 8:
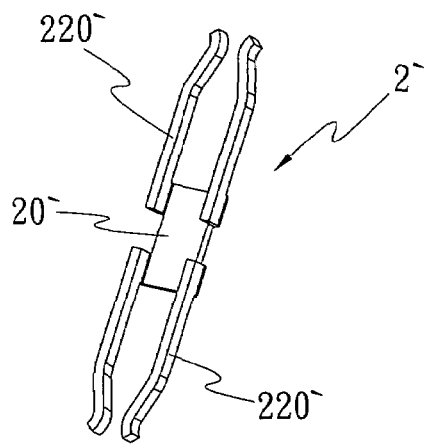
FIG. 8 is the 3D diagram of the first conductive terminal of the second embodiment of the electrical connector of this invention.
Figure 9:
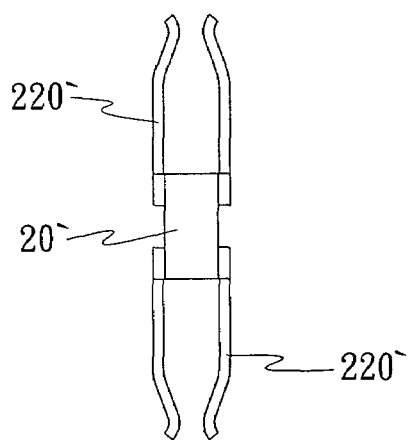
FIG. 9 is the front view of the first conductive terminal shown in FIG. 8.

Please refer to FIGS. 8 and 9. The illustrations are the second embodiment of the first conductive terminal of the electrical connector of this invention. The differences between this embodiment and the above stated embodiment are: the two elastic arms 220' of the first conductive terminal 2' of this embodiment is not on the same surface level with the body 20' but mutually perpendicular. This could also achieve the same results as the above stated embodiment in the realization process.

Figure 10:
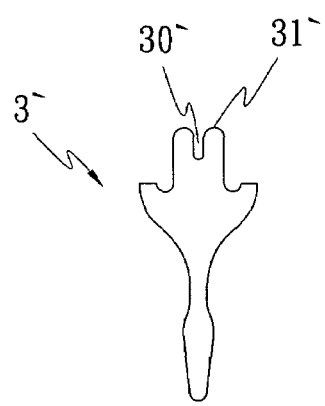
FIG. 10 is the 3D diagram of the second or the third conductive terminal of the third embodiment of the electrical connector of this invention.

Please refer to FIG. 10. The figure illustrates the third embodiment of the second or third conductive terminal of the electrical connector of this invention. The difference between this embodiment and the above stated embodiment is: the conductive connecting section 31' of the said conductive terminal 3' is designed with the two conductive connection points formed by a depression 30'. In the said embodiment, the first conductive terminal could also have the same structure as the first conductive terminal of the second embodiment. The stated results of the above embodiment could also be achieved during the implementation process.

Figure 11:
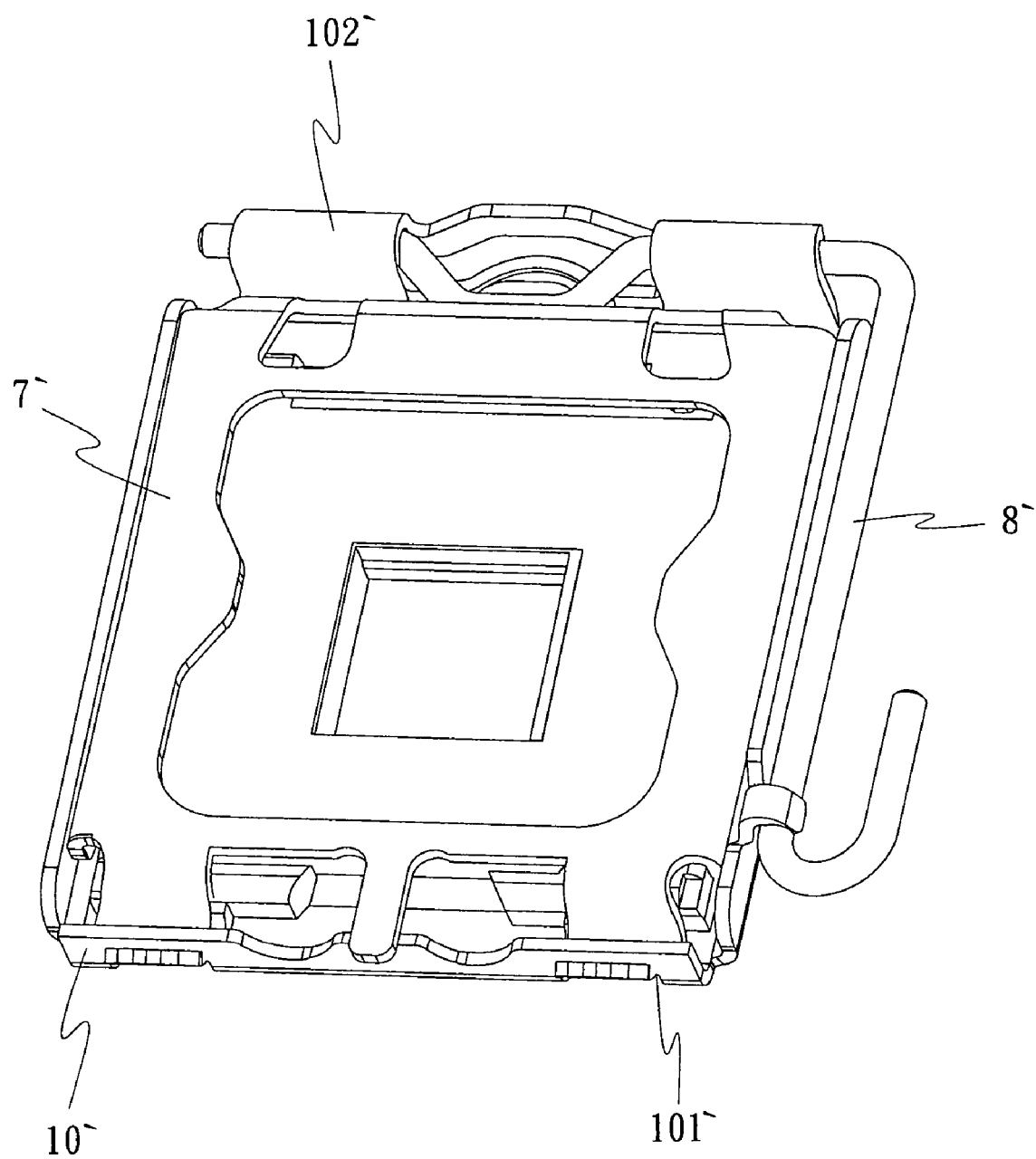
FIG. 11 is the 3D diagram of the fourth embodiment of the electrical connector of this invention.

Please refer to FIG. 11. This is the illustration of the fourth embodiment of the electrical connector of this invention. The difference between this embodiment and the first embodiment is: in the present embodiment, the top cover 7' of the said electrical connector is not connected to the insulator body. There is another metal base 10' installed in the electrical connector, the insulator body 1 is fixed to the metal base 10', one end of the metal base 10' is designed with centrally connected hole 101' of the top cover body 7', the other end is designed with a centrally connected section 102' of the centrally connected joystick 8'. The same result as the above stated embodiment can also be achieved during the implementing process.

What is claimed is:

1. An electrical connector comprising: an insulator body and a conductive terminal, several terminal receptor holes are installed on the insulator body, each receptor hole is installed with a first conductive terminal and second and third conductive terminals located at both ends of the first conductive terminal; the second and the third conductive terminal move relative to the first conductive terminal and in electrical contact with each other and form a press on type electrical connector.

2. The electrical connector according to claim 1, wherein the said second and third conductive terminals are of the same structure.

3. The electrical connector according to claim 1, wherein the part protruding the insulator body of the said second or third conductive terminal forms the conductive connecting section that could be electrically connected to external electronic components.

4. The electrical connector in according to claim 1, wherein the said second or third conductive terminal near one end of the first conductive terminal forms the press on section, the first conductive terminal is installed with the corresponding elastic section, the press on section and elastic section generates compression and cause the second or third conductive terminal to move relatively to the first conductive terminal.

5. The electrical connector according to claim 4, wherein the said elastic section is two elastic arms in parallel in general; the press on section is located between the two elastic arms that cause the elastic arms to extend outward.

6. The electrical connector according to claim 5, wherein there is at least a sloping surface installed on one of the said elastic arm and press on section, when the second and third conductive terminals are under pressure and move towards the first conductive terminal, the elastic arms will extend outward, when not under pressure, the elastic arm will return to original shape and spring back the second and third conductive terminal.

7. The electrical connector according to claim 1, wherein the said first conductive terminal forms click on fitting with the second or third conductive terminal through matched depressed and protruding shape.

8. The electrical connector according to claim 1, wherein the said first, second, and third conductive terminal are in the shape of laminar plates in general.

9. The electrical connector according to claim 1, wherein the thickness of the said second and third conductive terminal is larger than the thickness of the first conductive terminal.

10. The electrical connector according to claim 1, wherein the structure of the said second and third conductive terminals are the same; a first end of a selected terminal of the second and third conductive terminals protruding the insulator body forms the conductive connecting section that is electrically connected to external electronic components, a second end of the selected terminal forms the press on section, a groove is installed on the press on section, the first conductive terminal includes a body and elastic sections extending from the body towards two opposite ends, each of the elastic sections has two elastic arms in parallel in general; the end of each of the elastic sections is installed with a corresponding protruding section, the press on section is located between the two elastic arms, causing the first conductive terminal to click onto the second or third conductive terminal through the matched depressed and protruding shape, the protruding section and the groove of the press on section has at least one sloping surface, when the second and third conductive terminals are under pressure and move towards the first conductive terminal, the elastic arms will extend outwards, and when the pressure is removed from the second and third conductive terminals, the elastic section will return to original shape and springs back the second and third conductive terminal.

* * * * *